(12) United States Patent
Kwon et al.

(10) Patent No.: US 11,130,888 B2
(45) Date of Patent: Sep. 28, 2021

(54) STRETCHABLE CONDUCTOR SHEET, STRETCHABLE CONDUCTOR SHEET HAVING ADHESIVENESS, AND METHOD FOR FORMING ELECTRICAL WIRING COMPRISING STRETCHABLE CONDUCTOR ON FABRIC

(71) Applicant: TOYOBO CO., LTD., Osaka (JP)

(72) Inventors: Euichul Kwon, Shiga (JP); Sonoko Ishimaru, Shiga (JP); Michihiko Irie, Shiga (JP); Hiromichi Yonekura, Shiga (JP); Shota Morimoto, Shiga (JP)

(73) Assignee: TOYOBO CO., LTD., Osaka (JP)

( * ) Notice: Subject to any disclaimer, the term of this patent is extended or adjusted under 35 U.S.C. 154(b) by 364 days.

(21) Appl. No.: 16/082,085

(22) PCT Filed: Mar. 2, 2017

(86) PCT No.: PCT/JP2017/008285
§ 371 (c)(1),
(2) Date: Sep. 4, 2018

(87) PCT Pub. No.: WO2017/154726
PCT Pub. Date: Sep. 14, 2017

(65) Prior Publication Data
US 2020/0291273 A1    Sep. 17, 2020

(30) Foreign Application Priority Data

Mar. 8, 2016   (JP) .............................. JP2016-044426

(51) Int. Cl.
| | | |
|---|---|---|
| *B32B 27/12* | (2006.01) | |
| *H01B 1/22* | (2006.01) | |
| *H01B 1/24* | (2006.01) | |
| *H01B 5/14* | (2006.01) | |
| *H05K 3/20* | (2006.01) | |
| *C08K 3/04* | (2006.01) | |
| *C09J 9/02* | (2006.01) | |
| *C09J 7/35* | (2018.01) | |
| *C09J 5/06* | (2006.01) | |
| *C09J 7/29* | (2018.01) | |
| *C09J 7/40* | (2018.01) | |
| *H05K 1/02* | (2006.01) | |

(52) U.S. Cl.
CPC . *C09J 9/02* (2013.01); *C09J 5/06* (2013.01); *C09J 7/35* (2018.01); *C09J 7/405* (2018.01); *H01B 1/22* (2013.01); *H01B 1/24* (2013.01); *H01B 5/14* (2013.01); *H05K 1/0283* (2013.01); *H05K 3/20* (2013.01); *B32B 27/12* (2013.01); *C09J 2203/326* (2013.01); *C09J 2301/408* (2020.08)

(58) Field of Classification Search
None
See application file for complete search history.

(56) References Cited

U.S. PATENT DOCUMENTS

| | | | |
|---|---|---|---|
| 6,121,688 A * | 9/2000 | Akagawa | H01L 23/49827 257/778 |
| 6,294,257 B1 | 9/2001 | Tsukakoshi et al. | |
| 10,546,664 B2 * | 1/2020 | Yonekura | H01B 1/22 |
| 2006/0274049 A1 * | 12/2006 | Spath | B82Y 10/00 345/173 |

FOREIGN PATENT DOCUMENTS

| | | | | |
|---|---|---|---|---|
| EP | 2924695 A1 * | 9/2015 | | G01L 1/146 |
| JP | 62-58513 | 3/1987 | | |
| JP | 62-58514 | 3/1987 | | |
| JP | 3723565 | 12/2005 | | |
| JP | 2007-173226 | 7/2007 | | |
| JP | 2012-54192 | 3/2012 | | |
| JP | 2014-151018 | 8/2014 | | |
| WO | 98/40435 | 9/1998 | | |
| WO | 2014/080470 | 5/2014 | | |

OTHER PUBLICATIONS

Office Action dated May 17, 2019 in corresponding Chinese Patent Application No. 201780016105.8, with English Translation.
Notice of Reasons for Refusal dated Jun. 9, 2020 in corresponding Japanese Patent Application No. 2018-504420, with English Translation.
International Search Report dated Apr. 25, 2017 in International (PCT) Application No. PCT/JP2017/008285.

* cited by examiner

*Primary Examiner* — Sheeba Ahmed
(74) *Attorney, Agent, or Firm* — Wenderoth, Lind & Ponack, L.L.P.

(57) ABSTRACT

An objective is to provide a stretchable conductor sheet which is useful as a material for electrical wiring and electrodes for garment-type electronic devices, the material having excellent durability in terms of washing and durability in terms of perspiration. A fabric provided with an electrode and an electrical wiring, which are formed from a stretchable conductor sheet, is obtained by: providing a film having releasability with a first stretchable conductor layer which is formed from a paste material that uses carbon-based particles as a conductive filler, while using a flexible resin as a binder resin; subsequently forming a second stretchable conductor layer, while using metal-based particles as a conductive filler; laminating a hot melt adhesive layer thereon; superposing the resulting laminate on a fabric after removing unnecessary parts from the laminate by means of partial slits; and subjecting the resulting fabric to hot pressing. Since the carbon-based particles adsorb a contamination substance of the metal-based particles, oxidation degradation and sulfuration degradation of the metal-based particles is reduced, thereby improving the durability.

12 Claims, 3 Drawing Sheets

1. Stretchable conductor sheet

2. Forming slit

3. Removing unnecessary part

4. Stacking fabric, heating

5. Peeling off releasable film

STRETCHABLE CONDUCTOR SHEET, STRETCHABLE CONDUCTOR SHEET HAVING ADHESIVENESS, AND METHOD FOR FORMING ELECTRICAL WIRING COMPRISING STRETCHABLE CONDUCTOR ON FABRIC

TECHNICAL FIELD

The present invention relates to a sheet-like stretchable conductor sheet that is capable of being laminated on a stretchable substrate, and a method for forming an electrical wiring using the same that is used in a garment (an item of clothing)-type electronic device or the like.

BACKGROUND ART

Recently, a wearable electronic device intended to use an electronic device having input/output function, calculation function, and communication function in a state of being very close to or in close contact with a body has been developed. As such a wearable electronic device, devices with an accessory-type shape such as a wristwatch, eyeglasses, and earphones, and a textile-integrated device where electronic functions are incorporated into a garment are known.

An electrical wiring for power supply and signal transmission is necessary for an electronic device. In particular, for a textile-integrated wearable electronic device, the electrical wiring is required to have stretchability in accordance with a stretchable garment. Usually, an electrical wiring composed of a metal wire or metal foil inherently has no practical stretchability, and hence a technique for providing stretching capabilities in a pseudo manner by arranging a metal wire or metal foil in a wave shape or in a repeated horseshoes shape is employed. In the case of the metal wire, it is possible to form a wiring by regarding the metal wire as an embroidery yarn and sewing it into a garment. However, it is clear that such a method is not suitable for mass production.

A method of forming a wiring by etching the metal foil is common as a method for producing a printed wiring board. A method is known in which the metal foil is attached to a stretchable resin sheet, and a wave-shaped wire is formed in the same manner as in the printed wiring board to make a stretchable wiring in a pseudo manner. In this method, a stretchability is given in a pseudo manner by twist deformation of the wave-shaped wiring portion. However, metal foil varies also in the thickness direction due to the twist deformation, and thus if the metal foil is used as a part of a garment, the garment has uncomfortable wearing feeling, which is not preferable. In addition, when the metal foil undergoes excessive deformation due to washing or the like, permanent plastic deformation occurs in the metal foil, and the wiring may have the problem of the durability.

Patent Document 1 describes a method in which a region other than a region where an electrode or wiring is to be arranged on a fabric is masked, and then a conductive polymer-containing coating is applied to the fabric. There is concern about a garment formed by the method described in Patent Document 1 that disconnection may occur when used because a conductor layer cannot follow the stretch of the fabric. Furthermore, in the conductive fabric produced by such a method, since the conductive polymer-containing coating may permeate the inside of the fabric, it is hard to secure a satisfactory thickness of a conductive layer successively formed on the fabric, and hence it is difficult to realize a sufficiently low resistance as an electrical wiring.

As a method to realize a stretchable conductor wiring, a method using a special conductive paste has been proposed. In such a method, conductive particles such as silver particles, carbon particles, and carbon nanotubes, elastomer such as urethane resin with stretchability, natural rubber, or synthetic rubber, and a solvent etc. are kneaded to form a paste, and using the resulting paste, a wiring is printed and drawn on a garment directly or in combination with a stretchable film substrate or the like. A conductive composition composed of conductive particles and a stretchable binder resin can macroscopically realize a stretchable conductor. From a microscopic viewpoint, in the conductive composition obtained from the above-mentioned paste, the resin binder portion is deformed upon receiving an external force, and the conductivity is maintained within a range in which the electrical chain of the conductive particles is not broken. The resistivity observed macroscopically is higher than that of metal wires or metal foil. However, since the composition itself has stretchability, the wiring is not required to have a shape like a wave-shaped wiring, and flexibility in the width and the thickness of the wiring increases. Therefore, on a practical level, it is possible to realize a wiring with a low resistance compared with a metal wire.

Patent Document 2 discloses a technique in which silver particles and silicone rubber are combined, and the conductive film on the silicone rubber substrate is further covered with silicone rubber to suppress degradation of conductivity during elongation. Patent Document 3 discloses a combination of silver particles and a polyurethane emulsion and that a conductive film with high conductivity and a high elongation ratio can be obtained. Furthermore, many examples have also been proposed in which improvement of characteristics is attempted by combining conductive particles having a high aspect ratio such as carbon nanotubes, silver fillers, and the like.

A circuit wiring obtained by printing a conductive ink or conductive paste as described above is known as a so-called membrane circuit. The membrane circuit is used for keyboards of information terminals and switches and wirings of operation panels of household electric appliances. A main conductor is a cured product layer composed of a metal paste, mainly a silver paste formed by printing. In such a printed conductor mainly composed of silver, a wiring portion is covered with an insulating cover coat layer, and the surface of an electrode portion serving as a contact is covered with a conductive composition obtained from a conductive carbon ink. Such measures are aimed at protecting from oxidation or sulfurization, or contamination by environmental substances by sealing the conductive layer. The same way of thinking is applied not only to the conductor layer formed by printing but also to a printed wiring board in which a wiring is formed by etching a general copper foil. Usually, the wiring portion is covered with an insulating coat resin called a solder resist, and the electrode portion serving as a contact or a connecting portion is covered with a noble metal plating or solder. Generalizing this, it can be understood that it is a common practice in an electrical wiring to provide an appropriate surface layer on the conductive layer to handle so that the metal of the conductive layer is not directly exposed to the atmosphere.

This principle should be similarly applied to a stretchable conductor layer used for a garment-type electronic device. In particular, in such applications, the surface layer of an electrical wiring portion formed on the inside of the garment, that is, on the side coming into direct contact with a human body, is exposed not only to the atmosphere but also to moisture including bodily fluids such as sweat. There is a possibility that the surface layer may be exposed also to the weather and, in some cases, sea water. Furthermore, it must be recognized that it may be used under severe environments such as washing, drying, i.e., exposing to direct sunlight, or the like on a daily basis, and such environments are severer than use environments of ordinary printed wiring boards. Moreover, since a stretching action is always applied to a wiring in the garment-type electronic device when used, the surface layer must retain both the resistance to mechanical deformation and the protective function of a lower layer. However, in the techniques disclosed in these Patent Documents, a technique for protecting a conductive film from such a viewpoint is not disclosed.

Patent Document 4 discloses a technique for directly forming an electrical wiring in a garment by using a printing method. However, there is no description from the viewpoint of protecting a conductor layer as described above. At least a wiring layer and an insulating layer are necessary for the actual electrical wiring, and the alignment between the both is important. In Patent Document 4, on a part of the fabric surface of an electronic fabric or electronic garment, a flat smooth surface is previously formed by filling a plane including threads and gaps between the threads with resin and solidifying the resin, thereby improving printing performance. However, there is a concern of occurrence of a paradoxical problem that if the filling and solidification of the resin becomes excessive, the flexibility of the garment is lost, and if the filling and solidification of the resin is insufficient, the alignment becomes difficult.

Patent Document 5 discloses a flexible conductive member characterized by comprising an elastic substrate; and a plurality of conductive layers arranged on a surface of the substrate in at least one of a stacked manner and a parallel manner, wherein the conductive layers include a first conductive layer including a highly conductive material that contains an elastomer and a conductive agent and has a volume resistivity of $5 \times 10^{-2}$ Ω·cm or less in an unextended condition; and a second conductive layer including a highly extensible conductive material that has a volume resistivity in an unextended condition larger than the volume resistivity of the highly conductive material in an unextended condition, contains an elastomer and a conductive agent, and has a change in volume resistivity at an elongation of 50% relative to an unextended condition of 10 times or less. Patent Document 5 discloses an example in which a flexible conductor composition containing silver as a conductive filler and a flexible conductor composition containing a carbon-based material as a conductive filler are stacked, and it is described that high conductivity and high elongation are compatible by combining both these compositions. However, with regard to the layer structure, there is shown an example in which either one of the first conductive layer and the second conductive layer is used as a surface layer on each other, and the technical idea that one layer functions as a protective layer of the other layer cannot be read therefrom.

RELATED ART DOCUMENTS

Patent Documents

Patent Document 1: JP-A-2014-151018
Patent Document 2: JP-A-2007-173226
Patent Document 3: JP-A-2012-54192
Patent Document 4: JP-B-3723565
Patent Document 5: WO 2014/080470 A1

DISCLOSURE OF THE INVENTION

Problems to be Solved by the Invention

The present invention has been made by focusing on the above situation, and an object of thereof is to provide a stretchable conductor sheet in which a wiring can be accurately formed with respect to a stretchable substrate such as a fabric, and which has a surface layer having a sufficient protective function against contamination from a human body and has resistance to an ordinary use as clothing including washing and drying, and a method for forming an electrical wiring of a garment-type electronic device using the same.

Means for Solving the Problems

That is, present invention includes the following configurations.

[1] A stretchable conductor sheet comprising a plurality of layers comprising at least a first stretchable conductor layer and a second stretchable conductor layer, wherein the stretchable conductor sheet has an elongation at break of 50% or more, wherein the first stretchable conductor layer comprises a stretchable conductor composition containing carbon-based particles as a conductive filler, wherein the second stretchable conductor layer comprises a stretchable conductor composition containing metal-based particles as a conductive filler, and wherein the stretchable conductor sheet has a film resistance of 500 mΩ☐ or less when unstretched and a film resistance of 1 kΩ☐ or less in an elongation direction when stretched at a stretching rate of 50%.

[2] The stretchable conductor sheet according to the [1], wherein the first stretchable conductor layer has a thickness of 12 μm or more.

[3] The stretchable conductor sheet according to the [1] or [2], having an elongation at break of 65% or more.

[4] The stretchable conductor sheet according to any of the [1] to [3], wherein the first stretchable conductor layer contains carbon-based particles in an amount of 30% or more.

[5] The stretchable conductor sheet according to any of the [1] to [4],
wherein the first stretchable conductor layer contains carbon-based particles having a BET specific surface area of 1000 m²/g or more in an amount of 4% by mass or more.

[6] A stretchable conductor sheet having adhesiveness comprising a hot melt adhesive layer capable of adhering to a fabric by heating at a temperature in a range of 45° C. to 250° C. on the second stretchable conductor layer side of the stretchable conductor sheet according to any of the [1] to [5].

[7] The stretchable conductor sheet having adhesiveness according to the [6], comprising a releasable polymer film having a thickness of 15 to 190 μm of which at least one surface is a releasable surface,
wherein the stretchable conductor sheet having adhesiveness has a layer structure in which the first stretchable conductor layer, the second stretchable conductor layer, and the hot melt adhesive layer are formed in this order on the releasable surface of the releasable polymer film.

[8] The stretchable conductor sheet having adhesiveness according to the [7], wherein the releasable polymer film transmits 30% or more of visible light.

[9] A method for forming an electrical wiring comprising a stretchable conductor on a fabric, the method comprising:

[1] forming a slit in the stretchable conductor sheet having adhesiveness according to [7] or [8] from the hot melt layer side to a depth reaching the surface of the releasable polymer film to divide the stretchable conductor sheet having adhesiveness into a necessary part and an unnecessary part;

[2] peeling and removing the unnecessary part;

[3] stacking a fabric on the necessary part after removing the unnecessary part, followed by heating; and

[4] peeling off the releasable polymer film.

Effects of the Invention

In the present invention, the second stretchable conductor layer, which is a main conductor with high conductivity, is bonded to the fabric, preferably with a hot melt adhesive, and the first conductor layer having a protective function is provided on the surface side of the electrode, which comes in contact with a human body. The first stretchable conductor layer is required to have a function of protecting the second stretchable conductor layer. In the present invention, carbon-based particles are used as a conductive filler of the first stretchable conductor layer. In general, a conductive layer in which a conductive filler is blended is a composite material and thus microscopically poor in homogeneity, and microvoids and internal paths through the surface of the filler are likely to occur. Therefore, when such a conductive layer is used for a surface layer in a multilayer structure, it is difficult to impart a function of shielding an inner layer from contaminants. However, the first conductor layer of the present invention having predetermined physical properties and a predetermined thickness protects the second stretchable conductor layer from stretching loads at the time of wearing and washing. In addition, due to the carbon-based material having adsorption performance, the first conductor layer of the present invention exerts the effect of shielding against salts, hydrogen sulfide, ammonia and the like derived from living organisms, which affect the electric characteristics of the metallic filler in the second stretchable conductor layer. The shielding effect due to such adsorption is further increased by using specific carbon-based particles to be preferably used. As a result, even when wearing and washing are repeated, or even when left without being washed for a predetermined period of time after wearing, the sheet can be repeatedly used without impairing the conductivity as a whole.

Furthermore, in the present invention, a stretchable conductor layer having adhesiveness that has such a layer structure is formed preferably on a light transmissive release substrate, a slit is formed in the stretchable body portion leaving the release substrate to divide the stretchable conductor sheet into a necessary part and an unnecessary part, and the necessary part is transferred to a fabric after peeling and removing the unnecessary part in advance. Consequently, even if the wiring has a complicated shape, it can be easily handled since the release substrate serves as a temporary support body. In addition, since such a release substrate has light transmissive properties, positioning with respect to a predetermined portion of the fabric is easier. In the present invention, the first stretchable conductor layer that can be seen through the release substrate from the release substrate side is black due to the content of carbon-based filler at a high concentration, and even if the transparency of the substrate is relatively low, visibility is sufficiently ensured, so that accurate positioning can be achieved.

MODE FOR CARRYING OUT THE INVENTION

The conductive filler used in the composition constituting the first stretchable conductor layer of the present invention is composed of carbon-based particles. As the carbon-based particles in the present invention, graphite powder, activated carbon powder, flake graphite powder, acetylene black, Ketjenblack, fullerene, single-walled carbon nanotube, multi-walled carbon nanotube, carbon nanocone and the like can be used. In the present invention, graphite powder, flake graphite powder, activated carbon powder, and Ketjenblack are preferably used as the carbon-based particles. In the present invention, it is further preferable to use carbon-based particles at least having a BET specific surface area of 1000 $m^2/g$ or more.

The composition constituting the first stretchable conductor layer of the present invention is composed of the above-mentioned carbon-based particles and a flexible resin binder. The carbon-based particles can be blended in an amount of 18 to 60% by mass relative to the total mass of the carbon-based particles and the binder. The carbon-based particles in the present invention are preferably contained in an amount of 30% by mass or more, more preferably 33% by mass or more, further preferably 36% by mass or more, and still further preferably 39% by mass or more relative to the total mass of the carbon-based particles and the binder. If the content of the carbon-based particles is less than the predetermined range, not only the necessary conductivity cannot be obtained but also the protective function for a covered layer deteriorates. On the other hand, if the content exceeds this range, the elongation at break of the film is lowered.

The composition constituting the first stretchable conductor layer of the present invention preferably contains 4% by mass or more, more preferably 6% by mass or more, and still more preferably 8% by mass or more of carbon-based particles having a BET specific surface area of $1000 \text{ m}^2/\text{g}$ or more. By blending carbon-based particles having a BET specific surface area of $1000 \text{ m}^2/\text{g}$, the protective function for a covered layer is remarkably improved.

In the present invention, the conductive filler used for the stretchable conductor composition constituting the second stretchable conductor layer is composed of metal-based particles. As the metal-based particles, metal particles such as silver, gold, platinum, palladium, copper, nickel, aluminum, zinc, lead, and tin, alloy particles such as brass, bronze, cupronickel, and solder, hybrid particles such as silver-coated copper, metal-plated polymer particles, metal-plated glass particles, metal-coated ceramic particles, and the like can be used. In addition, carbon-based particles may be secondarily used in combination.

In the present invention, it is preferred to mainly use flaky silver particles or an irregular-shaped aggregated silver powder. Here, the "mainly use" means that the amount of 90% by mass or more of the conductive particles is used. The irregular-shaped aggregated powder is made by three-dimensional aggregation of spherical or irregular-shaped primary particles. The irregular-shaped aggregated powder and the flaky powder are preferable because they have a specific surface area larger than that of spherical powder or the like, and hence an electrical conductivity network can be formed even when the filling amount is small. The irregular-shaped aggregated powder, which is not in a monodisperse form, is further preferable because the particles physically contact with each other, and hence an electrical conductivity network can be easily formed.

Although there is no particular limitation for the particle diameter of the flaky powder, the average particle diameter (50% D) measured by a dynamic light scattering method is preferably 0.5 to 20 μm, and more preferably 3 to 12 μm. If the average particle diameter exceeds 15 μm, the formation of a fine wiring may become difficult, and clogging occurs in the case of screen printing or the like. If the average particle diameter is less than 0.5 μm, the particles cannot contact with each other when the filling amount is small, and as a result, the electrical conductivity may deteriorate.

Although there is no particular limitation for the particle diameter of the irregular-shaped aggregated powder, the average particle diameter (50% D) measured by a light scattering method is preferably 1 to 20 μm, and more preferably 3 to 12 μm. If the average particle diameter exceeds 20 μm, the dispersibility decrease, and as a result, paste formation may become difficult. If the average particle diameter is less than 1 μm, the effects as the aggregated powder is lost, and as a result, high electrical conductivity may not be maintained when the filling amount is small.

The composition constituting the second stretchable conductor layer of the present invention is composed of the above-mentioned metal-based particles and a flexible resin binder. The metal-based particles can be blended in an amount of 40 to 92% by mass relative to the total mass of the metal-based particles and the binder. The metal-based particles in the present invention are preferably contained in an amount of 50 to 90% by mass, more preferably 58 to 88% by mass, further preferably 66 to 86% by mass, and still further preferably 70 to 85% by mass relative to the total mass of the metal-based particles and the binder. If the content of the metal-based particles is less than the predetermined range, the conductivity deteriorates, and hence the necessary conductivity cannot be obtained. On the other hand, if the content exceeds this range, the elongation at break of the film is lowered.

In the present invention, nonconductive particles may be blended in the composition constituting the second stretchable conductor layer. The inorganic particles in the present invention are added for the purpose of improving printing properties, stretching properties and coating film surface properties, and inorganic particles such as silica, titanium oxide, talc, and alumina, microgel made of a resin material, and the like can be used.

In the present invention, it is preferable to use barium sulfate particles as non-conductive particles. As the barium sulfate particles in the present invention, ground barite obtainable by grinding a barite mineral called a natural barite, and a so-called precipitated barium sulfate produced by a chemical reaction can be used. It is preferred in the present invention to use the precipitated barium sulfate of which particle diameter is easily controlled. The average particle diameter of the barium sulfate particles preferably used, as determined by a dynamic light scattering method, is preferably 0.01 to 18 μm, more preferably 0.05 to 8 μm, and further preferably 0.2 to 3 μm. In addition, the barium sulfate particles in the present invention are preferably subjected to a surface treatment with a hydroxide and/or oxide of one or both of Al and Si. By such a surface treatment, the hydroxide and/or oxide of one or both of Al and Si adhere to the surface of the barium sulfate particles. The adhering amount of these compounds is preferably 0.5 to 50, and more preferably 2 to 30 relative to 100 of barium elements at an element ratio detected by X-ray fluorescence analysis.

In the present invention, the flexible resin binder of the composition constituting the first stretchable conductor layer and the second stretchable conductor layer means a resin having an elastic modulus of 1 to 1000 MPa. As the flexible resin binder, thermoplastic resins, thermosetting resins, or rubbers having an elastic modulus of 1 to 1000 MPa can be given. Examples of such flexible resin include thermoplastic resins, thermosetting resins, rubbers and the like, and rubbers or urethane is preferable in order to develop the film stretchability. Examples of the rubbers include urethane rubber, acrylic rubber, silicone rubber, butadiene rubber, rubber containing a nitrile group such as nitrile rubber or hydrogenated nitrile rubber, isoprene rubber, vulcanized rubber, styrene-butadiene rubber, butyl rubber, chlorosulfonated polyethylene rubber, ethylene propylene rubber, vinylidene fluoride copolymer, and the like. Among these, rubber containing a nitrile group, chloroprene rubber, and chlorosulfonated polyethylene rubber are preferable, and rubber containing a nitrile group is particularly preferable. The elastic modulus in the present invention is preferably within a range of 3 to 600 MPa, more preferably 10 to 500 MPa, further preferably 30 to 300 MPa.

There is no particular limitation for the rubber containing a nitrile group as far as it is a rubber or elastomer containing a nitrile group, and nitrile rubber and hydrogenated nitrile rubber are preferable. Nitrile rubber is a copolymer of butadiene with acrylonitrile, and when the amount of bonding acrylonitrile increases, affinity with metal increases but rubber elasticity contributing to stretchability rather decreases. Therefore, the amount of bonding acrylonitrile in the acrylonitrile butadiene copolymer rubber is preferably 18 to 50% by mass, and more preferably 40 to 50% by mass.

Furthermore, an epoxy resin may be blended to the conductive paste in the present invention. The epoxy resin in the present invention is preferably a bisphenol A type epoxy resin or a phenol novolac type epoxy resin. When blending an epoxy resin, a curing agent for the epoxy resin may be blended. As the curing agent, known amine compounds, polyamine compounds and the like can be used. The curing agent is preferably contained in an amount of 5 to 50% by mass, and more preferably 10 to 30% by mass relative to the epoxy resin. Moreover, the amount of the epoxy resin and the curing agent is 3 to 40% by mass, preferably 5 to 30% by mass, more preferably 8 to 24% by mass relative to the all resin components including the flexible resin.

In the present invention, the flexible resin binders of the respective compositions constituting the first stretchable conductor and the second stretchable conductor may be the same or different. In the present invention, it is preferable that both have a common component from the viewpoint of adhesiveness between both layers.

In the present invention, an individual elongation at break of each of the first stretchable conductor and the second stretchable conductor is preferably 65% or more, more preferably 80% or more, and still more preferably 110% or more.

As a method for producing the stretchable conductor sheet of the present invention, a method can be exemplified in which the composition constituting each of the first stretchable conductor and the second stretchable conductor is compounded by melt-kneading at a temperature at which the flexible resin component is sufficiently softened, and film formation is performed by sequentially stacking or simultaneously stacking layers with a melt extruder. This method is preferably used when high productivity is required.

As a method for producing the stretchable conductor sheet of the present invention, a method can be exemplified in which a solvent capable of dissolving and dispersing a flexible resin component is further blended in the materials contained in the composition constituting each of the first stretchable conductor and the second stretchable conductor, after processing the blended materials into a slurry or paste, a sheet is formed by sequentially or simultaneously applying the slurry or paste to a support body and drying.

The stretchable conductor sheet of the present invention can be obtained by further adding a solvent to the composition constituting each of the first stretchable conductor and the second stretchable conductor to form a paste or slurry, and by applying or printing the paste or slurry sequentially or simultaneously onto a substrate to form two layers, followed by drying. The solvent in the present invention is water or an organic solvent. The content of the solvent is not particularly limited as it should be appropriately found according to the viscosity required of the paste, but it is preferably 30 to 80 mass ratio when the total mass of the conductive filler, the flexible resin binder, and other solid components added as necessary is 100.

As to the organic solvent used in the present invention, its boiling point is preferred to be equal to or higher than 100° C. and lower than 300° C., and more preferred to be equal to or higher than 130° C. and lower than 280° C. When the boiling point of the organic solvent is too low, the solvent may be evaporated during the paste production process and during use of the paste, and there is concern that the ratio of the ingredients constituting the conductive paste will be apt to change. On the other hand, when the boiling point of the organic solvent is too high, the amount of solvent remaining in the dried and cured coat becomes large, and hence there is concern that reliability of the coat will deteriorate.

Specific examples of the organic solvent using in the present invention include cyclohexanone, toluene, xylene, isophorone, γ-butyrolactone, benzyl alcohol, Solvesso 100, 150 and 200 (manufactured by Exxon Chemical), propylene glycol monomethyl ether acetate, terpineol, butyl glycol acetate, diamylbenzene, triamylbenzene, n-dodecanol, diethylene glycol, ethylene glycol monoethyl ether acetate, diethylene glycol monoethyl ether acetate, diethylene glycol monobutyl ether acetate, diethylene glycol dibutyl ether, diethylene glycol monoacetate, triethylene glycol diacetate, triethylene glycol, triethylene glycol monomethyl ether, triethylene glycol monoethyl ether, triethylene glycol monobutyl ether, tetraethylene glycol, tetraethylene glycol monobutyl ether, tripropylene glycol, tripropylene glycol monomethyl ether, and 2,2,4-trimethyl-1,3-pentanediol monoisobutyrate. As to a petroleum hydrocarbon, there may be exemplified AF Solvent No. 4 (boiling point: 240 to 265° C.), Solvesso No. 5 (boiling point: 275 to 306° C.), Solvesso No. 6 (boiling point: 296 to 317° C.), Solvesso No. 7 (boiling point: 259 to 282° C.), and No. 0 Solvent H (boiling point: 245 to 265° C.) etc. manufactured by Nippon Oil Corporation. If necessary, the organic solvent may be used singly, or in combination of two or more thereof. Such organic solvents are appropriately contained such that a conductive silver paste has a viscosity suitable for printing or the like.

The paste for forming a stretchable conductor in the present invention can be prepared by mixing and dispersing the conductive particles, the barium sulfate particles, the stretchable resin, and the solvent as materials with a disperser such as a dissolver, three-roll mill, rotation/revolution mixer, attritor, ball mill, sand mill or the like. In the present invention, when the melt viscosity of the flexible resin binder is relatively low, it is also possible to melt-knead the conductive filler and the flexible resin binder without using a solvent to form a composition, and melt-extrude the composition to obtain a stretchable conductor sheet having a two-layer structure.

In the stretchable conductor sheet including a plurality of layers of the present invention, the film resistance when unstretched is 500 mΩ☐ or less, preferably 360 mΩ☐ or less, more preferably 240 mΩ☐ or less, further preferably 120 mΩ☐ or less. Here, the film resistance, which is also referred to as a sheet resistance, is a resistance value in a plane direction extending from one side of a square sheet toward one side at the opposite side. In practice, it can be determined by determining a resistance value in the length direction of a rectangle and converting it into a square based on the aspect ratio of the rectangle. The film resistance of the present invention is a practical characteristic measured in a state where two types of stretchable conductor sheets are laminated.

In the stretchable conductor sheet of the present invention, the film resistance in an elongation direction when stretched at a stretching rate of 50% is 1 kΩ☐ or less. This is a sheet resistance in a state of 50% stretching, that is, in a state where the length is elongated 1.5 times longer, and it should be noted that this is a resistance of a square film in a state where the width direction and the thickness direction are contracted with respect to the length direction. In the measurement, a rectangular sheet is stretched to obtain a resistance value in the longitudinal direction, and the obtained resistance value is converted into a square based on the length and the width of the sheet when stretched to determine a film resistance.

The thickness of the stretchable conductor sheet of the present invention is not particularly limited as long as it is large enough to obtain a predetermined film resistance. As for the preferable thickness of the stretchable conductor sheet, the total thickness of the first stretchable conductor layer and the second stretchable conductor layer is preferably 15 to 1500 μm, more preferably 20 to 900 μm, still more preferably 26 to 500 μm, further preferably 32 to 300 μm, still further preferably 38 to 200 μm, and even more preferably 42 to 120 μm.

In the present invention, the first stretchable conductor layer preferably has a thickness of 12 μm or more. The thickness of the first stretchable conductor influences the protective effect of the second stretchable conductor by the first stretchable conductor layer. If the thickness of the first stretchable conductor is insufficient, the deterioration of the second stretchable conductor is easily accelerated.

When the thickness of the stretchable conductor sheet including the first and second stretchable conductor layers is 24 to 48 μm, the thickness of the first stretchable conductor layer is preferably not less than half of the total thickness of the stretchable conductor sheet. When the total thickness is 48 μm or more, the thickness of the first stretchable conductor layer is preferably one-third or more of the total thickness of the stretchable conductor sheet.

The stretchable conductor sheet of the present invention has an elongation at break of 65% or more, preferably 85% or more, more preferably 110% or more, and still more preferably 140% or more. When the elongation at break is less than this range, cracks are likely to occur at the time of stretching, and as a result, deterioration of the second stretchable conductor layer due to oxidation, sulfurization or the like is likely to occur.

The hot melt adhesive layer in the present invention is an adhesive composed of a thermoplastic resin capable of adhering to a fabric by heating at a temperature in the range of 45° C. to 250° C., or a thermosetting resin in an uncured or half-cured state, which is called a reactive hot melt adhesive. More specifically, a polyester-based, polyurethane-based, ethylene vinyl acetate-based, polyamide-based, polyolefin-based, polyparaffin-based, epoxy-based, acrylic-based, or other hot melt type adhesive resin can be used. The hot melt adhesive layer in the present invention adheres to a fabric by heating at a temperature preferably in the range of 60° C. to 230° C., more preferably in the range of 80° C. to 210° C., and further preferably in the range of 90° C. to 180° C. The adhering temperature is appropriately selected depending on the heat resistance of a fabric. When the fabric is a common fabric made of chemical fiber, adhering is possible by heating at a temperature in a relatively low temperature range of 150° C. or lower, and when the fabric is made of cotton or heat-resistant fiber, adhering is possible by heating at a temperature of 150° C. or higher, and preferably 180° C. or higher.

The thickness of the hot melt adhesive layer is preferably 5 to 200 μm, more preferably 12 to 150 μm, and further preferably 20 to 120 μm.

As the release film used in the present invention, a polyester film such as a PET film, PEN film or the like of which at least one surface is subjected to a release treatment can be used. As the release treatment, fluororesin coating, silicone resin coating, fluorine plasma treatment, or the like can be exemplified. It is also possible to use a film or sheet made of a material poor in adhesiveness such as an untreated polyimide film, fluororesin film, silicone resin sheet, polypropylene film, or polyethylene film. Of course, these difficult-to-bond films may be further subjected to a surface treatment.

The thickness of the release film of the present invention is preferably 15 to 190 μm, more preferably 24 to 130 μm, and still more preferably 40 to 105 μm. If the thickness of the release film is not within the predetermined range, when a slit is formed only in the laminated stretchable conductor sheet portion, the slit may possibly be short or cut also the release film.

The release film of the present invention preferably has transparency. The release film of the present invention preferably has an average transmittance for visible light of 30% or more, more preferably 50% or more, and still more preferably 70% or more. If the transparency of the release film is insufficient, positioning when the stretchable conductor sheet in which a slit has been preliminarily formed and the unnecessary portion has been removed is transferred onto a fabric becomes difficult.

The release film of the present invention preferably has certain heat resistance. Heat resistance can be determined by a glass transition temperature or softening temperature. In the present invention, it is preferable that the higher of either the glass transition temperature or the softening temperature be 50° C. or higher, more preferably 65° C. or higher, still more preferably 85° C. or higher, further preferably 125° C. or higher, and still further preferably 175° C. or higher. The heat resistance of the release film is appropriately selected depending on the temperature at which the stretchable conductor sheet adheres to the fabric using the hot melt adhesive layer. In the present invention, the adhesive strength between the first stretchable conductor layer and the release film is 0.03 N/cm to 4.0 N/cm, preferably 0.1 N/cm to 2.0 N/cm. When the adhesive strength is below this range, the handling properties of the sheet may deteriorates.

The stretchable conductor sheet having the release film and the hot melt adhesive layer of the present invention can be obtained by forming a first stretchable conductor layer on a release layer side of a release film, further forming a second stretchable conductor layer, and forming a hot melt adhesive layer. The first stretchable conductor layer and the second stretchable conductor layer may be sequentially stacked or may be simultaneously formed by co-extrusion or a wet-on-wet coating method. Similarly, the hot melt adhesive layer may be formed simultaneously with the stretchable conductor layers by co-extrusion or coating. It is also possible to obtain such a configuration by separately laminating a hot melt adhesive layer on the stretchable conductor layer by press-lamination or roll-lamination as a simpler method.

When the stretchable conductor sheet having the release film and the hot melt adhesive layer of the present invention is used, an electrical wiring can be transferred to a fabric by the following method, and a garment with an electrical wiring can be easily obtained.

Figure 1:
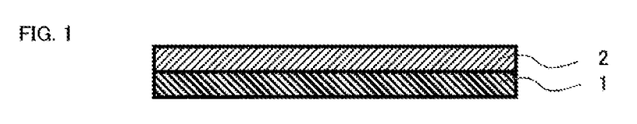
FIG. 1 is a schematic view showing a cross section of a stretchable conductor sheet of the present invention including a first stretchable conductor layer and a second stretchable conductor layer.
Figure 2:
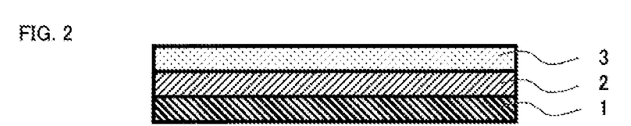
FIG. 2 is a schematic view showing a cross section of a stretchable conductor sheet having adhesiveness of the present invention including a first stretchable conductor layer, a second stretchable conductor layer, and a hot melt layer.
Figure 3:
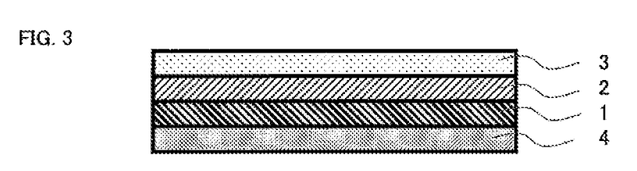
FIG. 3 is a schematic view showing a cross section of a stretchable conductor sheet having adhesiveness of the present invention including a release film, a first stretchable conductor layer, a second stretchable conductor layer, and a hot melt layer.
Figure 4:
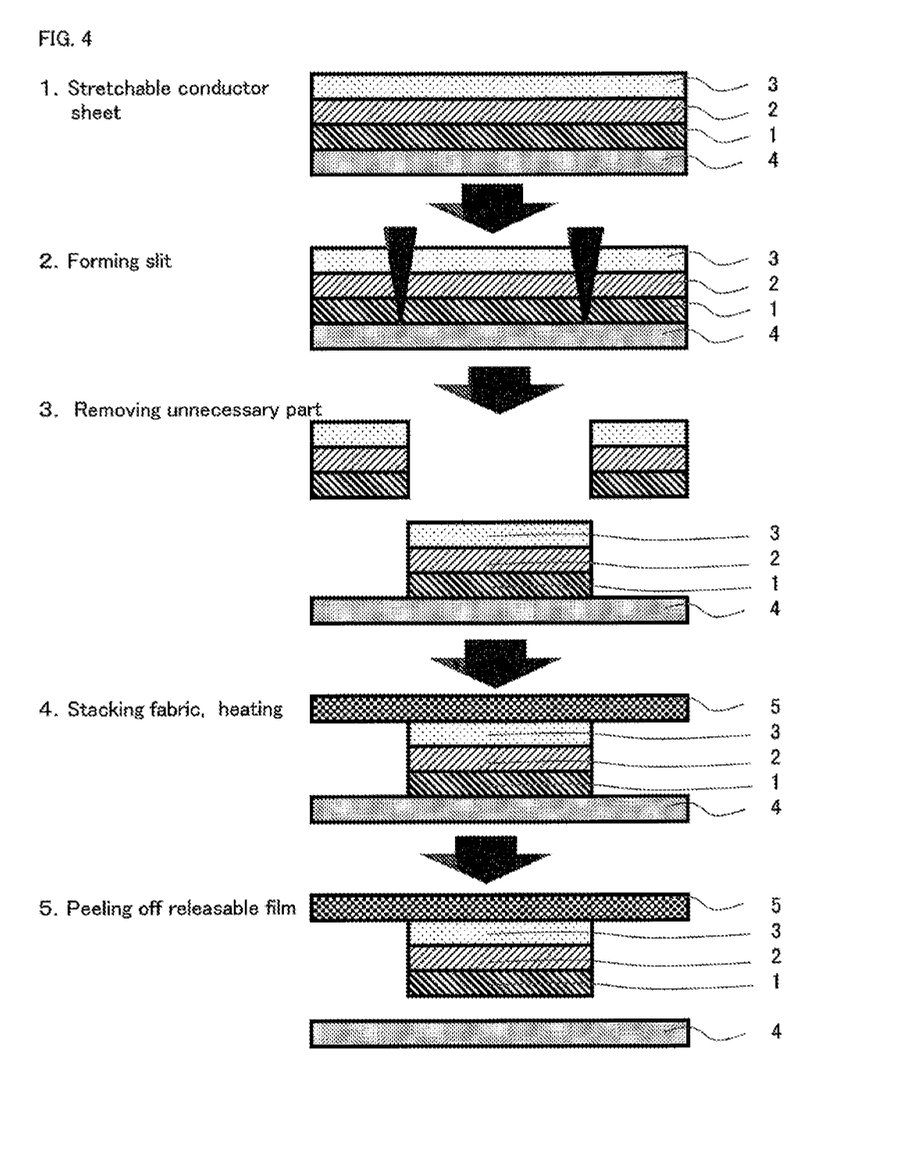
FIG. 4 is a schematic view showing a method of forming an electrical wiring on a fabric by using a transfer method using a stretchable conductive sheet having adhesiveness of the present invention.

A preferred method of forming an electrical wiring of the present invention will be described with reference to FIG. 4. FIG. 4-1 shows the stretchable conductor sheet having the hot melt adhesive layer and the release film of the present invention. In FIG. 4-2, by slitting from the hot melt adhesive layer side, slits are formed in the hot melt adhesive layer and the first and second stretchable conductor layers. The slits may reach the release film, but caution must be exercised not to cut the release film.

In FIG. 4-3, the central portion between the slits formed is left on the release film, and the outer portions are removed as an unnecessary portion. In FIG. 4-4, a fabric is stacked, and the hot melt adhesive layer and the fabric are allowed to adhere to each other by heating, preferably by pressing and heating at the same time, from the fabric side or the release film side or from both sides. At this time, since the release film has transparency, the position of the fabric can be confirmed through the release film, so that the positioning can be accurately performed. The formation of a pattern on the stretchable conductor side is carried out by means of the slits on the release film. Therefore, in the case where the fabric has already been processed into a garment, even if an electrical wiring straddles the seams on the garment, the electrical wiring can be formed without any problem. In FIG. 4-5, the release film is peeled off to obtain a garment with an electrical wiring.

Figure 5:
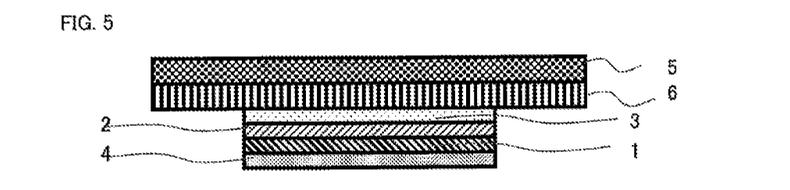
FIG. 5 is a schematic cross-sectional view showing a case where an underlying layer is provided on a fabric in advance.
Figure 6:
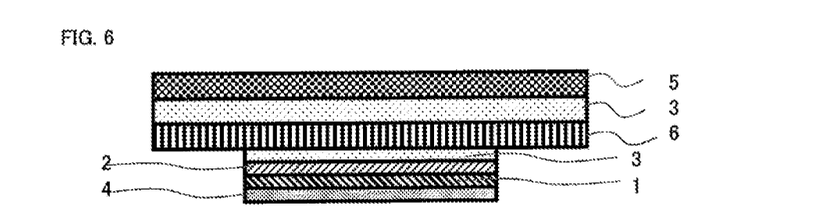
FIG. 6 is a schematic cross-sectional view showing a case where an underlying layer adheres to a fabric via an adhesive layer.

In FIG. 4, the case where no underlying layer is especially formed on the fabric side is illustrated. If there is a need to reinforce the fabric, if there is a difficulty in adhesion between the fabric and the hot melt adhesive, or if a high insulation performance is required on the fabric side, an underlying layer can be provided on the fabric side in advance as shown in FIG. 5. The underlying layer of the present invention is preferably formed by applying a coating liquid, an immersion liquid, a printing ink, a printing paste or the like in a liquid form or a slurry state onto a substrate. When a film that is separately formed in advance is used as an underlying layer, a film that serves as an underlying layer may be previously allowed to adhere to a fabric using a hot melt adhesive layer or the like, and then an electrical wiring may be provided as shown in FIG. 6. Means for adhering of the underlying layer to the fabric is not particularly limited to the hot melt adhesive layer.

Figure 7:
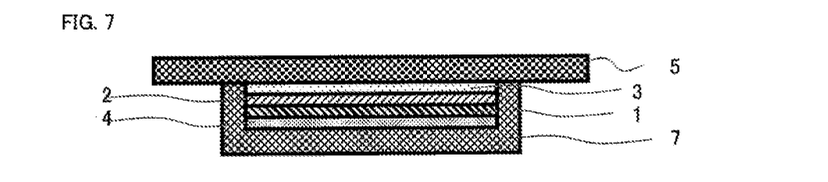
FIG. 7 is a schematic cross-sectional view showing a case where a stretchable conductor sheet adheres to a fabric without an underlying layer and a cover coat layer is further provided.
Figure 8:
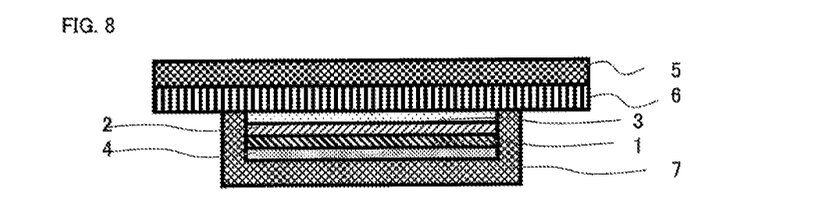
FIG. 8 is a schematic cross-sectional view showing a case where a stretchable conductor sheet adheres to a fabric having an underlying layer, and a cover coat layer is further provided.
Figure 9:
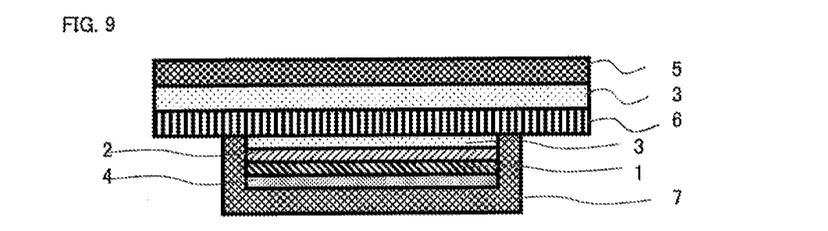
FIG. 9 is a schematic cross-sectional view showing a case where an underlying layer adheres to a fabric via an adhesive layer, a stretchable conductor sheet adheres to the underlying layer, and a cover coat layer is further provided.

On the electrical wiring on the garment formed as described above, a cover coat layer is further provided for insulation and protection as shown in FIG. 7, FIG. 8, and FIG. 9. The cover coat layer that is an insulating cover layer of the present invention has a function of insulation on the surface side of the wiring portion. Here, the insulation includes mechanical, chemical and biological insulations in addition to electrical insulation, and requires a function to insulate the conductive layer from moisture, chemical substances, biological substances penetrated through the substrate.

The insulating cover layer of the present invention is preferably composed of a flexible polymeric material. As the flexible polymeric material, a material that is so-called rubber or elastomer can be used. As such rubber or elastomer of the present invention, a resin material for forming the conductive layer can be used.

The insulating cover layer of the present invention preferably has stretchability capable of repeated stretching of 10% or more. In addition, the insulating cover layer of the present invention preferably has an elongation at break of 50% or more. Furthermore, the insulating cover layer of the present invention preferably has a tensile elastic modulus of 10 to 500 MPa.

The insulating cover layer of the present invention is preferably formed by applying a coating liquid, an immersion liquid, a printing ink, a printing paste or the like in a liquid form or a slurry state onto a substrate. To bring a material for the insulating cover layer into a liquid form or a slurry state, it may be dissolved and dispersed in a solvent. It is within the scope of the present invention to blend a known leveling agent, thixotropic property imparting agent and the like for adjusting printability and the like. The solvent is appropriately selected from solvents and the like which can be used for a conductive paste.

In the present invention, as a special case, when a precursor of a material for forming the insulating cover layer is a liquid, it is also possible that a layer formed using the precursor is subjected to an appropriate reaction to form a cover layer. The case where an ultraviolet curable resin or the like is used falls under this case.

When it is difficult to bring a material for forming the insulating cover layer of the present invention into in a liquid state or a slurry state, it is also possible that the material is processed into a film form or sheet form, for example, by melt extrusion molding or press molding, and then the film or sheet is processed into an appropriate outer shape and bonded to a substrate with an adhesive or the like.

In the present invention, a fabric constituting a part or whole of the garment of the garment-type electronic device can be used as a substrate. Examples of the fabric include a woven fabric, a knitted fabric, and a nonwoven fabric, and coated fabrics obtained by subjecting these fabrics to resin-coating or resin-impregnation and the like can also be used as a substrate. A synthetic rubber sheet typified by Neoprene (registered trademark) can also be used as a substrate. A fabric to be used in the present invention preferably has stretchability capable of repeated stretching of 10% or more. Moreover, the substrate of the present invention preferably has an elongation at break of 50% or more. The substrate of the present invention may be a raw fabric, may be in the form of ribbon or tape, or may be a braid or net, or a piece of fabric cut from a raw fabric.

When the fabric is a woven fabric, examples thereof include plain weave, twill weave, sateen weave, and the like. When the fabric is a knitted fabric, examples thereof include knitted fabrics of plain stitch, modified stitches thereof, moss stitch, crepe stitch, lace stitch, eyelet stitch, plating stitch, pile stitch, rib stitch, ripple stitch, hexagonal stitch, blister stitch, milano rib stitch, double pique stitch, single pique stitch, twill stitch, herringbone stitch, ponte rome stitch, basket stitch, tricot stitch, half tricot stitch, satin tricot stitch, double tricot stitch, queen's cord stitch, striped seersucker stitch, raschel stitch, tulle mesh stitch, modified stitches thereof and combinations thereof. The fabric may be a nonwoven fabric made of elastomer fiber or the like.

EXAMPLES

Hereinafter, the invention will be explained in more detail and specifically by further showing examples. Evaluation results etc. of examples were measured by the following method.

<Amount of Nitrile>

The amount of nitrile was converted from the composition ratio obtained by analyzing the resulting resin material by NMR to a ratio by mass (% by mass) of monomer.

<Mooney Viscosity>

The measurement was conducted using SMV-300RT "Mooney Viscometer" manufactured by Shimadzu Corporation.

<Average Particle Diameter>

The measurement was performed using a light-scattering particle size distribution analyzer LB-500 manufactured by Horiba, Ltd.

<Elastic Modulus and Elongation at Break>

As for resin materials and paste materials, each of the materials was applied to a release sheet so as to have a dry thickness of 100±10 μm, followed by drying and curing under predetermined conditions, and the resulting sheet together with the release sheet were punched out into a dumbbell shape defined by ISO 527-2-1A to obtain a test piece. As for sheet materials, the sheet was likewise punched out into a dumbbell shape to obtain a test piece. In the case of the sheet including a release sheet, the sheet of each material was peeled off from the release sheet at the time of measurement to evaluate. In the case of the sheet adhering to a fabric, the sheet including the fabric was subjected to a tensile test. In the case of the sheet adhering to the fabric, when the fabric was regarded as having a sufficiently high elongation at break as compared with the stretchable conductor sheet, a test was conducted while monitoring a resistance between clips of a tensile tester with the tester, and it was judged to be broken at the time when electrical continuity ceases. The tensile test was carried out by the method defined in ISO 527-1.

<Film Resistance>

The stretchable conductor sheet that adhered to the fabric was cut out so as to have a size of 10 mm×80 mm to obtain a test piece. The test piece was clipped such that a portion to be stretched had an effective length of 50 mm, the initial resistance value between clips was measured, and the initial film resistance was determined by the following equation:

Initial film resistance=initial resistance value×$(W_0/L_0)$ wherein $W_0$=10 mm, and $L_0$=50 mm.

Subsequently, the film was stretched by 50% (1.5 times longer), the resistance value at stretching and the sheet width $W_{50}$ of the central portion of the test piece were measured with calipers, and the film resistance at stretching was determined by the following equation:

Film resistance at stretching=resistance value at stretching×$(W_{50}/L_{50})$ wherein $L_{50}$=75 mm.

Here, a 2-way tricot fabric "KNZ2740" (nylon yarn: urethane yarn=63%:37% (blend ratio), areal weight: 194 g/m$^2$) manufactured by GUNSEN was used as the fabric. For adhering to the fabric, a polyurethane hot melt film "Ecellent SHM104-PUR" (melting point: 100° C., thickness: 70 μm) manufactured by NTW Co., Ltd. was used. When an object to be measured has already been bonded to a fabric, it may be used as it is.

<Measurement of Resistance Value>

The resistance value of the wiring was measured using Milliohmmeter manufactured by Agilent Technologies.

<Washing Durability>

Using a test piece prepared by the same method as in the measurement of film resistance, machine washing was carried out 30 times using a washing net by the 5-times acceleration method (after washing 5 times consecutively, drying once in the shade indoors) based on the method specified in JIB L 0844, and the rate (%) of increase of the resistance value after washing 30 times relative to the initial resistance value in the length direction of the test piece was determined. When the value reached 1000-fold or more of the initial resistance value, it was judged to be "a break in wiring". As a detergent, a powder type of Attack was used.

<Sweat Durability>

Using a test piece prepared by the same method as in the measurement of film resistance, 50% stretching was repeated 100 times, and then the test piece was immersed in the artificial sweat solution specified in JIS L 0848: 2004 for one hour. Then, the test piece was pulled out and allowed to stand in an environment of 30'C and 80% RH for 48 hours, and the rate of increase of the resistance value after the test relative to the initial resistance value was determined.

Production Example 1

<Polymerization of Synthetic Rubber Material>

The following materials were put into a stainless steel reactor equipped with a stirrer and a water cooling jacket and gently stirred while keeping the bath temperature at 15° C. by flowing nitrogen.

| | |
|---|---|
| butadiene | 61 parts by mass |
| acrylonitrile | 39 parts by mass |
| deionized water | 270 parts by mass |
| sodium dodecylbenzenesulfonate | 0.5 part by mass |
| sodium naphthalenesulfonate condensate | 2.5 parts by mass |
| t-dodecyl mercaptan | 0.3 part by mass |
| triethanolamine | 0.2 part by mass |
| sodium carbonate | 0.1 part by mass |

Next, an aqueous solution prepared by dissolving 0.3 part by mass of potassium persulfate in 19.7 parts by mass of deionized water was added dropwise into the reactor over 30 minutes, reaction was further continued for 20 hours, an aqueous solution prepared by dissolving 0.5 part by mass of hydroquinone in 19.5 parts by mass of deionized water was then added thereto, and an operation for stopping the polymerization reaction was carried out.

Next, in order to distill off unreacted monomers, the pressure in the reactor was first reduced, and then steam was introduced into the reactor to recover the unreacted monomers, thereby to obtain a synthetic rubber latex (L1) composed of NBR.

Sodium chloride and dilute sulfuric acid were added to the obtained latex, aggregation and filtration were performed. Then, deionized water in an amount 20 times in volume ratio to the resin was divided in five portions, the resin was washed by repeating redispersion in the deionized water and filtration, and dried in air to obtain a synthetic rubber resin R01. As for the synthetic rubber resin R01, the nitrile amount was 39% by mass, the Mooney viscosity was 51, and the elastic modulus was 42 MPa.

Production Example 2

A synthetic rubber resin R02 was obtained in the same manner as in Production Example 1, except that 40 parts by mass of styrene and 60 parts by mass of butadiene were used instead of acrylonitrile and butadiene in Production Example 1. As for the synthetic rubber resin R02, the nitrile amount was 0% by mass, the Mooney viscosity was 67, and the elastic modulus was 51 MPa.

[Production Example of Conductive Paste]

Using the materials shown in Table 1, conductive pastes were prepared with the blend ratio shown in Table 2. A resin component was dissolved in a half amount of a solvent, and to the resultant resin solution, conductive particles, nonconductive particles, and the remaining amount of the solvent were added, uniformly mixed, and then dispersed by a three-roll mill to obtain a conductive paste. The compositions of the conductive pastes and the individual properties of the film obtained from each of the conductive pastes are shown in Table 2.

TABLE 1

| | | |
|---|---|---|
| Carbon-based particles | CB01 | Flake graphite manufactured by Chuetsu Graphite Industry Co., Ltd. Graphite BF-1AT (average particle diameter 1 μm) |
| | CB02 | Graphite powder manufactured by Lion Specialty Chemicals Co., Ltd. Ketchen black EC300J BET specific surface area 800(m2/g) |
| | CB03 | Graphite powder manufactured by Lien Specialty Chemicals Co., Ltd. Ketchen black EC600JD BET specific surface area 1270(m2/g) |
| | CB04 | Carbon nanotube VGCF manufactured by Shewa Denko KK |
| | CB05 | Flake graphite manufactured by Chuetsu Graphite Industry Co., Ltd. Graphite BF (average particle diameter 5 μm) |
| Metal-based particles | Ag01 | Fine flaky silver powder manufactured by Fukuda Metal Foil Powder Industry Co., Ltd. Ag-XF301 (average particle diameter 6 μm) |
| | Ag02 | Aggregated silver powder G-35 (average particle diameter 6.0 μm) manufactured by Dowa Electronics Co., Ltd. |
| | Ag03 | Small-diameter silver powder SPQ03R (average particle diameter 0.7 μm) manufactured by Mitsui Mining & Smelting Co., Ltd. |
| Nonconductive particles | BaSO4 | Titanium oxide particles R-62N manufactured by Sakai Chemical Industry Co., Ltd, average particle diameter was 0.3 μm. |
| Resin binders | R01 | Nitrile butadiene rubber resin obtained in Production Example 1. |
| | R02 | Styrene butadiene rubber resin obtained in Production Example 2. |
| | R03 | Acrylic rubber polymer Nipole AR 42 W manufactured by Zeon Corporation |
| | R04 | Urethane rubber polymer Byron BX 1001 manufactured by Toyobo Co., Ltd |
| | R05 | Bisphenol A type epoxy resin JER-828 (epoxy equivalent: 184 to 194) manufactured by Mitsubishi Chemical Corporation |
| | R06 | Acrylonitrile butadiene rubber Nipole DN003 manufactured by Zeon Corporation |
| Curing agent | HD | Latent curing agent Amicure PN 23 manufactured by Ajinomoto Fine Chemical Co., Ltd. |
| Solvent | BC | Butyl carbitol acetate |
| | IP | Isophorone |

TABLE 2

| | | Paste for first stretchable conductor layer | | | | | | Paste for second stretchable conductor layer | | | |
|---|---|---|---|---|---|---|---|---|---|---|---|
| Composition | | CA | CB | CC | CD | CE | CF | AA | AB | AC | AD |
| Carbon-based particles | CB01 | 37 | 25 | 37 | — | 25 | — | — | — | — | — |
| | CB02 | — | — | — | 12 | — | — | — | — | — | — |
| | CB03 | 3 | 5 | 8 | — | 5 | 4 | — | — | — | — |
| | CB04 | — | — | — | 16 | — | — | — | — | — | — |
| | CB05 | — | — | — | — | — | 31 | — | — | — | — |
| Metal-based particles | Ag01 | — | — | — | — | — | — | 20 | — | 80 | — |
| | Ag02 | — | — | — | — | — | — | 60 | 50 | — | 83 |
| | Ag03 | — | — | — | — | — | — | — | 30 | — | — |
| Non-conductive particles | BaSO4 | — | — | — | — | — | — | — | 3 | — | 2 |
| Resin binders | R01 | — | 50 | 45 | — | 35 | — | — | 10 | — | — |
| | R02 | — | 20 | 10 | — | — | — | — | 7 | — | — |
| | R03 | — | — | — | 72 | — | — | — | — | — | — |
| | R04 | 60 | — | — | — | — | — | 20 | — | 20 | — |
| | Ro5 | — | — | — | — | 33 | — | — | — | — | — |
| | Ro6 | — | — | — | — | — | 65 | — | — | — | 15 |
| Curing agent | HD | — | — | — | — | 2 | — | — | — | — | — |
| Solvent | IP | — | 300 | 300 | 300 | 300 | 300 | — | 45 | — | 45 |
| | BC | 300 | — | — | — | — | — | 45 | — | 45 | — |
| Elastic modulus | MPa | 35 | 24 | 25 | 18 | 2500 | 10 | 80 | 160 | 100 | 25 |
| Elongation at break | % | 110 | 120 | 450 | 55 | 25 | 1200 | 140 | 130 | 100 | 500 |

[Production of Stretchable Conductor Sheet]

A paste for forming a first stretchable conductor was applied to a release PET film having a thickness of 75 μm using an applicator so as to have a dry film thickness shown in Table 3, and then dried and cured. Next, a paste for forming a second stretchable conductor was likewise applied, and then dried and cured to obtain a stretchable conductor sheet composed of a plurality of layers.

On the second stretchable conductor paste surface of the obtained stretchable conductor sheet, a polyurethane hot melt film "Ecellent SHM104-PUR" (with a separate sheet) manufactured by NTW Co., Ltd. was stacked, and they were allowed to adhere to each other by a roll lamination machine of which the temperature of the rubber roller was adjusted to 120° C. to obtain a stretchable conductor sheet having adhesiveness.

[Die-Punching and Adhering to Fabric]

The obtained stretchable conductor sheet having adhesiveness was set in a die punching machine, and a rectangle having a width of 10 mm and a length of 80 mm was punched out from the separate sheet side of the hot melt film using a Thomson blade. The depth of the Thomson blade was a depth reaching the hot melt sheet and the second stretchable conductor layer and the first stretchable conductor layer, and the release PET film was left without punching out.

Subsequently, a portion other than the rectangle having a width of 10 mm and a length of 80 mm was peeled and removed from the sheet after die-punching, and the separate sheet remaining on the rectangular portion was peeled off. A 2-way tricot fabric KNZ 2740 manufactured by GUNSEN having a width of 30 mm and a length of 100 mm was stacked such that the stretchable conductor sheet was arranged in the center of the tricot fabric, and pressed at 105° C. under a pressure of 0.03 MPa for 25 seconds by a press machine to adhere to each other. Then, the release PET film was peeled off to obtain a stretchable conductor sheet that adhered to the tricot fabric.

Using the obtained stretchable conductor sheet that adhered to the tricot fabric, initial film resistance, film resistance at 50% stretching, elongation at break, washing durability, and sweat durability were evaluated. The results are shown in Tables 3 and 4.

TABLE 3

| Layer structure/ Characteristics | | Unit | Example 1 | Example 2 | Example 3 | Comparative Example 1 | Example 4 | Example 5 | Comparative Example 2 | Comparative Example 3 |
|---|---|---|---|---|---|---|---|---|---|---|
| First stretchable conductor layer | CA | μm | 40 | 25 | 15 | 10 | — | — | — | — |
| | CB | μm | — | — | — | — | 20 | — | — | — |
| | CC | μm | — | — | — | — | — | 20 | — | — |
| | CD | μm | — | — | — | — | — | — | 20 | — |
| | CE | μm | — | — | — | — | — | — | — | 20 |
| | CF | μm | — | — | — | — | — | — | — | — |
| Second stretchable conductor layer | AA | μm | 40 | 40 | 40 | 40 | 40 | 40 | 40 | 40 |
| | AB | μm | — | — | — | — | — | — | — | — |
| | AC | μm | — | — | — | — | — | — | — | — |
| | AD | μm | — | — | — | — | — | — | — | — |
| Film resistance | Initial resistance | mΩ□ | 41 | 38 | 66 | 74 | 41 | 38 | 44 | 40 |
| | Resistance at stretching rate of 50% | Ω□ | 13 | 2.8 | 5.4 | 5.9 | 6.1 | 46 | 27 | 35 |
| Elongation at break | | % | 75 | 70 | 80 | 95 | 100 | 70 | 55 | 15 |
| Washing durability | Visual observation | Cracks | absence | absence | absence | absence | absence | absence | prescence | prescence |
| | Rate of increase of resistance | % | 15 | 11 | 16 | 65 | 12 | 25 | 34 | 54 |
| Sweat durability | Rate of increase of resistance | % | 16 | 21 | 30 | 120 | 15 | 21 | >1000 | >1000 |

TABLE 4

| Layer structure/ Characteristics | | Unit | Example 7 | Comparative Example 4 | Example 8 | Example 9 | Example 10 | Comparative Example 5 | Example 11 |
|---|---|---|---|---|---|---|---|---|---|
| First stretchable conductor layer | CA | μm | — | — | — | — | — | — | — |
| | CB | μm | — | — | 25 | 25 | 30 | — | — |
| | CC | μm | 20 | — | — | — | — | — | — |
| | CD | μm | — | — | — | — | — | — | — |
| | CE | μm | — | 20 | — | — | — | — | — |
| | CF | μm | — | — | — | — | — | — | 50 |
| Second stretchable conductor layer | AA | μm | — | — | — | — | — | 80 | — |
| | AB | μm | — | — | — | — | — | — | — |
| | AC | μm | 40 | 40 | 25 | 55 | 90 | — | — |
| | AD | μm | — | — | — | — | — | — | 40 |
| Film resistance | Initial resistance | mΩ□ | 65 | 400 | 73 | 62 | 51 | 53 | 400 |
| | Resistance at stretching rate of 50% | Ω□ | 47 | 250 | 46 | 36 | 41 | 56 | 3 |
| Elongation at break | | % | 80 | 10 | 105 | 110 | 90 | 140 | 1000 |
| Washing durability | Visual observation | Cracks | absence | absence | absence | absence | absence | prescence | absence |
| | Rate of increase of resistance | % | 23 | 300 | 13 | 26 | 18 | 80 | 10 |
| Sweat durability | Rate of increase of resistance | % | 19 | 140 | 17 | 20 | 21 | >1000 | 10 |

All of the stretchable conductor sheets of the Examples exhibit good washing durability and good sweat durability. In all of the Comparative Examples, it is apparent that the resistance values after the sweat durability test were remarkably increased. When these samples were cut, and the cross sections thereof were observed, in each of the test pieces whose resistance value increased after the sweat durability test, a part in which the second conductor layer was discolored yellow or brown was found. On the other hand, in each of the test pieces in which the increase in resistance value was not observed, the cross section of the second conductor layer was silver white as in the state before the test. Consequently, the increase in resistance value was interpreted to be the result of the second conductor layer having conductivity being mainly oxidized or sulfurized.

INDUSTRIAL APPLICABILITY

As described above, using the stretchable conductor sheet of the present invention, an electrode or an electrical wiring excellent in washing durability and sweat durability can be formed on a fabric. Therefore, the stretchable conductor sheet of the present invention can be suitably used as an electrical wiring material when producing a garment-type electronic device.

The present invention is widely applicable, without being limited to the use examples exemplified in the above example, to a wearable device for detecting information of a human body such as bioelectric potential including myoelectric potential and cardiac potential, and biological information including body temperature, pulse, blood pressure, and the like with a sensor or the like provided in a garment; a garment incorporating an electric heating device; a wearable device incorporating a sensor for measuring a clothing pressure; wear that measures a body size by using a clothing pressure; a sock-type device for measuring a pressure of a sole of foot; and the like. Moreover, the present invention is applicable to a garment in which flexible solar cell modules are integrated in textiles; a wiring part of a tent, bag or the like; a low frequency treatment apparatus having a joint part; a wiring part of a thermal treatment apparatus or the like; a sensing part of degree of flexion, and the like. Such wearable devices can be used for not only a human body but also an animal such as pet or livestock, can be applied to a mechanical device having an expandable portion, a bending portion, and the like, and can also be used as an electrical wiring of a system that is used by connecting a mechanical device such as a robotic prosthetic arm or leg to a human body. In addition, it is also useful as a wiring material for an implant device to be embedded in the body.

EXPLANATION OF REFERENCES

1. First stretchable conductor layer
2. Second stretchable conductor layer
3. Hot melt layer
4. Release film
5. Fabric
6. Underlying layer
7. Cover coat layer

The invention claimed is:

1. A stretchable conductor sheet comprising a plurality of layers comprising at least a first stretchable conductor layer and a second stretchable conductor layer,
    wherein the stretchable conductor sheet has an elongation at break of 50% or more,
    wherein the first stretchable conductor layer comprises a stretchable conductor composition containing carbon-based particles as a conductive filler,
    wherein the second stretchable conductor layer comprises a stretchable conductor composition containing metal-based particles as a conductive filler, and
    wherein the stretchable conductor sheet has a film resistance of 500 mΩ☐ less when unstretched and a film resistance of 1 kΩ☐ or less in an elongation direction when stretched at a stretching rate of 50%.

2. The stretchable conductor sheet according to claim 1, wherein the first stretchable conductor layer has a thickness of 12 μm or more.

3. The stretchable conductor sheet according to claim 1, having an elongation at break of 65% or more.

4. The stretchable conductor sheet according to claim 1, wherein the first stretchable conductor layer contains carbon-based particles in an amount of 30 weight % or more.

5. The stretchable conductor sheet according to claim 1, wherein the first stretchable conductor layer contains carbon-based particles having a BET specific surface area of 1000 m$^2$/g or more in an amount of 4% by mass or more.

6. A stretchable conductor sheet having adhesiveness comprising a hot melt adhesive layer capable of adhering to a fabric by heating at a temperature in a range of 45° C. to 250° C. on the second stretchable conductor layer side of the stretchable conductor sheet according to claim 1.

7. The stretchable conductor sheet having adhesiveness according to claim 6, comprising a releasable polymer film having a thickness of 15 to 190 μm of which at least one surface is a releasable surface,
    wherein the stretchable conductor sheet having adhesiveness has a layer structure in which the first stretchable conductor layer, the second stretchable conductor layer, and the hot melt adhesive layer are formed in this order on the releasable surface of the releasable polymer film.

8. The stretchable conductor sheet having adhesiveness according to claim 7, wherein the releasable polymer film transmits 30% or more of visible light.

9. A method for forming an electrical wiring comprising a stretchable conductor on a fabric, the method comprising:
    (1) forming a slit in the stretchable conductor sheet having adhesiveness according to claim 7 from the hot melt layer side to a depth reaching the surface of the releasable polymer film to divide the stretchable conductor sheet having adhesiveness into a necessary part and an unnecessary part;
    (2) peeling and removing the unnecessary part;
    (3) stacking a fabric on the necessary part after removing the unnecessary part, followed by heating; and
    (4) peeling off the releasable polymer film.

10. The stretchable conductor sheet according to claim 1, wherein the carbon-based particles are at least one selected from the group consisting of graphite powder, activated carbon powder, flake graphite powder, acetylene black, Ketjenblack, fullerene, multi-walled carbon nanotube, and carbon nanocone.

11. The stretchable conductor sheet according to claim 1, wherein the carbon-based particles are at least one selected from the group consisting of graphite powder, activated carbon powder, flake graphite powder, and Ketjenblack.

12. The stretchable conductor sheet according to claim 1, wherein the stretchable conductor composition of the first stretchable conductor layer contains a rubber containing a nitrile group and/or a elastomer containing a nitrile group, wherein the stretchable conductor composition of the second stretchable conductor layer contains a rubber containing a nitrile group and/or a elastomer containing a nitrile group.

* * * * *